United States Patent [19]

Chu

[11] Patent Number: 5,574,389

[45] Date of Patent: Nov. 12, 1996

[54] CMOS 3.3 VOLT OUTPUT BUFFER WITH 5 VOLT PROTECTION

[75] Inventor: Ke-Cheng Chu, Ping-Tung Hsien, Taiwan

[73] Assignee: Taiwan Semiconductor Manufacturing Company Ltd., Hsin-Chu, Taiwan

[21] Appl. No.: 513,053

[22] Filed: Aug. 9, 1995

[51] Int. Cl.[6] ............................................. H03K 19/0948
[52] U.S. Cl. ................................. 326/81; 326/83; 326/33
[58] Field of Search ............................... 326/80–81, 83, 326/86–87, 30–31, 33, 121; 327/534

[56] References Cited

U.S. PATENT DOCUMENTS

| | | | |
|---|---|---|---|
| 4,782,250 | 11/1988 | Adams et al. | 307/473 |
| 4,963,766 | 10/1990 | Lundberg | 307/451 |
| 5,004,936 | 4/1991 | Andresen | 326/87 |
| 5,144,165 | 9/1992 | Dhong et al. | 326/33 |
| 5,160,855 | 11/1992 | Dobberpuhl | 326/62 |
| 5,239,214 | 8/1993 | Segawa et al. | 326/58 |
| 5,300,835 | 4/1994 | Assar et al. | 307/475 |
| 5,381,059 | 1/1995 | Douglas | 326/58 |
| 5,387,826 | 2/1995 | Shay et al. | 326/33 |
| 5,396,128 | 3/1995 | Dunning et al. | 326/68 |
| 5,406,140 | 4/1995 | Wert et al. | 326/33 |
| 5,450,025 | 9/1995 | Shay | 326/81 |
| 5,451,889 | 9/1995 | Heim et al. | 327/534 |

*Primary Examiner*—Edward P. Westin
*Assistant Examiner*—Jon Santamauro
*Attorney, Agent, or Firm*—George O. Saile; Larry J. Prescott

[57] ABSTRACT

As VLSI chip design migrates from 5 volt designs to lower voltage designs, such as 3.3 volts, interfacing components with different power supplies is an unavoidable issue. This invention provides simple and inexpensive circuits which will pass the voltage at the output node of a CMOS buffer circuit to the isolation well of the P channel metal oxide semiconductor field effect transistor in the buffer circuit when the voltage at the output node is greater than the voltage at the buffer voltage supply node. This prevents forward biasing the PN junction in the isolation well of the P channel metal oxide semiconductor field effect transistor. The circuits also provide the proper voltage level to the gate of the P channel field effect transistor.

13 Claims, 3 Drawing Sheets

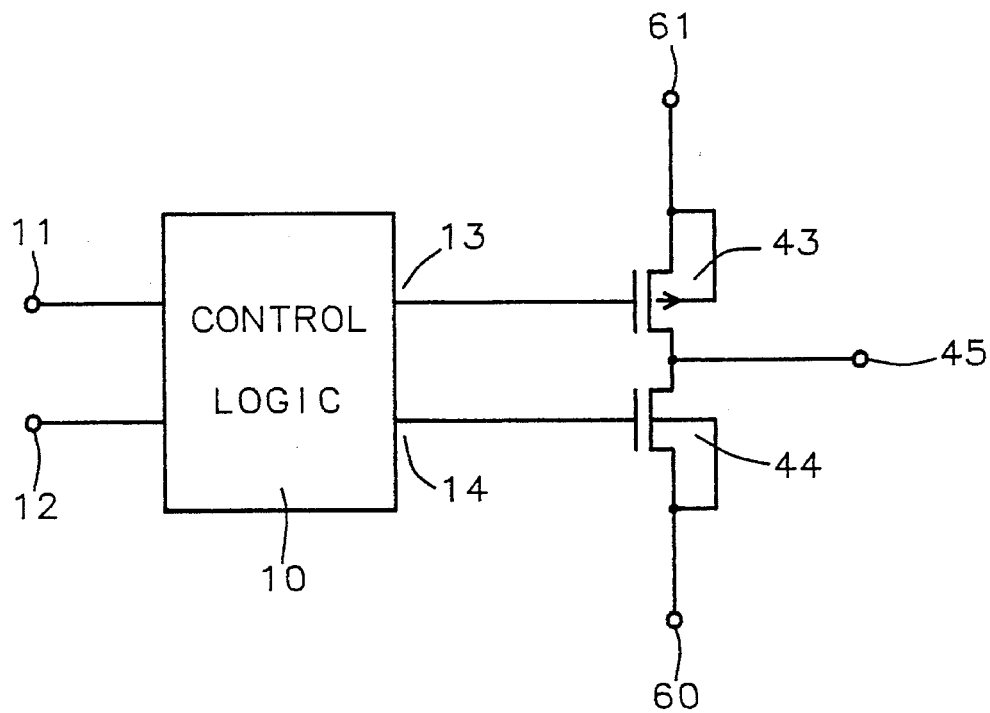
FIG. 1 – Prior Art
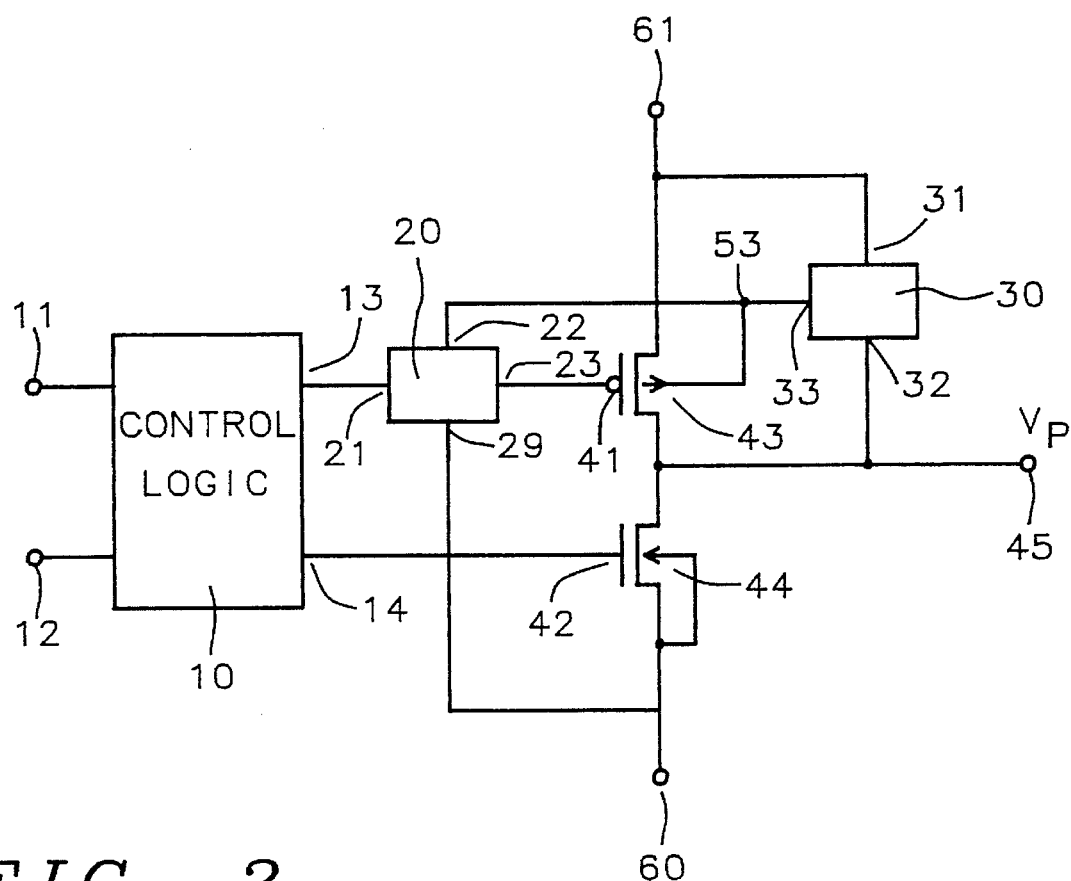
FIG. 2

5,574,389

CMOS 3.3 VOLT OUTPUT BUFFER WITH 5 VOLT PROTECTION

BACKGROUND OF THE INVENTION (1) Field Of The Invention

The invention provides a solution to the problem of interfacing CMOS circuits using 3.3 volt power supplies with circuits using 5.0 volt power supplies. The invention provides a simple circuit to prevent the PN junctions in the isolation wells of metal oxide semiconductor field effect transistors from becoming forward biased.

(2) Description Of Related Art

As VLSI chip design migrates from 5 volt designs to lower voltage designs, such as 3.3 volts, interfacing components with different power supplies is an unavoidable issue. U.S. Pat. No. 4,782,250 to Adams et al, U.S. Pat. No. 4,963,766 to Lundberg, U.S. Pat. No. 5,300,835 to Assar et al, U.S. Pat. No. 5,381,059 to Douglas, and U.S. Pat. No. 5,396,128 to Dunning et al all address the problem of interfacing a CMOS output buffer with higher voltage external circuits. However, these inventions offer solutions having more complex circuit designs than the circuits of this invention.

This invention provides a solution to the problem of interfacing with higher voltage external circuits which uses simple and inexpensive circuits.

SUMMARY OF THE INVENTION

As VLSI, or very large scale integration, chip design migrates from higher voltage levels, for example about 5.0 volts to lower voltage levels, for example about 3.3 volts, it becomes necessary to interface components operating at higher voltage levels with components at lower voltage levels. When components operating at higher voltage levels interface with components operating at lower voltage levels there is a possibility of large leakage currents because the isolation junction in the isolation well of channel metal oxide semiconductor field effect transistors can become forward biased.

FIG. 1 shows a diagram of a conventional CMOS, or complimentary metal oxide semiconductor, field effect transistor buffer circuit connected to a control logic circuit 10 for a tristatable control circuit. When the voltage at the second output node 14 of the control logic circuit is high, a logical one, the N channel metal oxide semiconductor, or NMOS, field effect transistor 44 is turned on and the output node 45 is connected to the reference voltage node 60 which is at ground potential. In this situation there is no leakage problem. However, when the buffer is in the high impedance state and the voltage at the output voltage node 45 is driven above the voltage level at the buffer voltage supply node 61, $V_{DD}$, by circuitry operating at higher voltage levels, the PN junction of the isolation well in the PMOS field effect transistor 43 will become forward biased, excessive leakage current will flow from the output node 45 to the buffer voltage supply node 61, and possible component damage will result. In this example the voltage level at the buffer supply voltage node is about 3.3 volts and the voltage at the output node 45 can be about 5.0 volts. Circuitry developed to deal with this problem is complicated and expensive.

It is the objective of this invention to provide simple circuits which will prevent leakage current from flowing from the output node back to buffer voltage supply node when the voltage at the output node is greater than the voltage at the buffer voltage supply node.

It is a further objective of this invention to provide the proper voltage at the gate of the P channel metal oxide semiconductor field effect transistor.

This objective is achieved by providing circuits which will pass the voltage at the output node of the CMOS buffer circuit to the to the isolation well of the P channel metal oxide semiconductor field effect transistor when the voltage at the output node is greater than the voltage at the buffer voltage supply node. The circuits also provide the proper voltage level; either the reference voltage level, the voltage at the buffer voltage supply node, or the voltage at the output node; to the gate of the P channel field effect transistor depending on the voltage at the output node, the level of the data control signal, and the level of the tristate control signal.

BRIEF DESCRIPTION OF THE DRAWINGS

FIG. 1 shows a diagram of a prior art CMOS buffer output circuit driven by a control logic circuit.

FIG. 2 shows a block diagram of the high voltage tolerant output buffer circuit of this invention.

DESCRIPTION OF PREFERRED EMBODIMENTS

Figure 6:
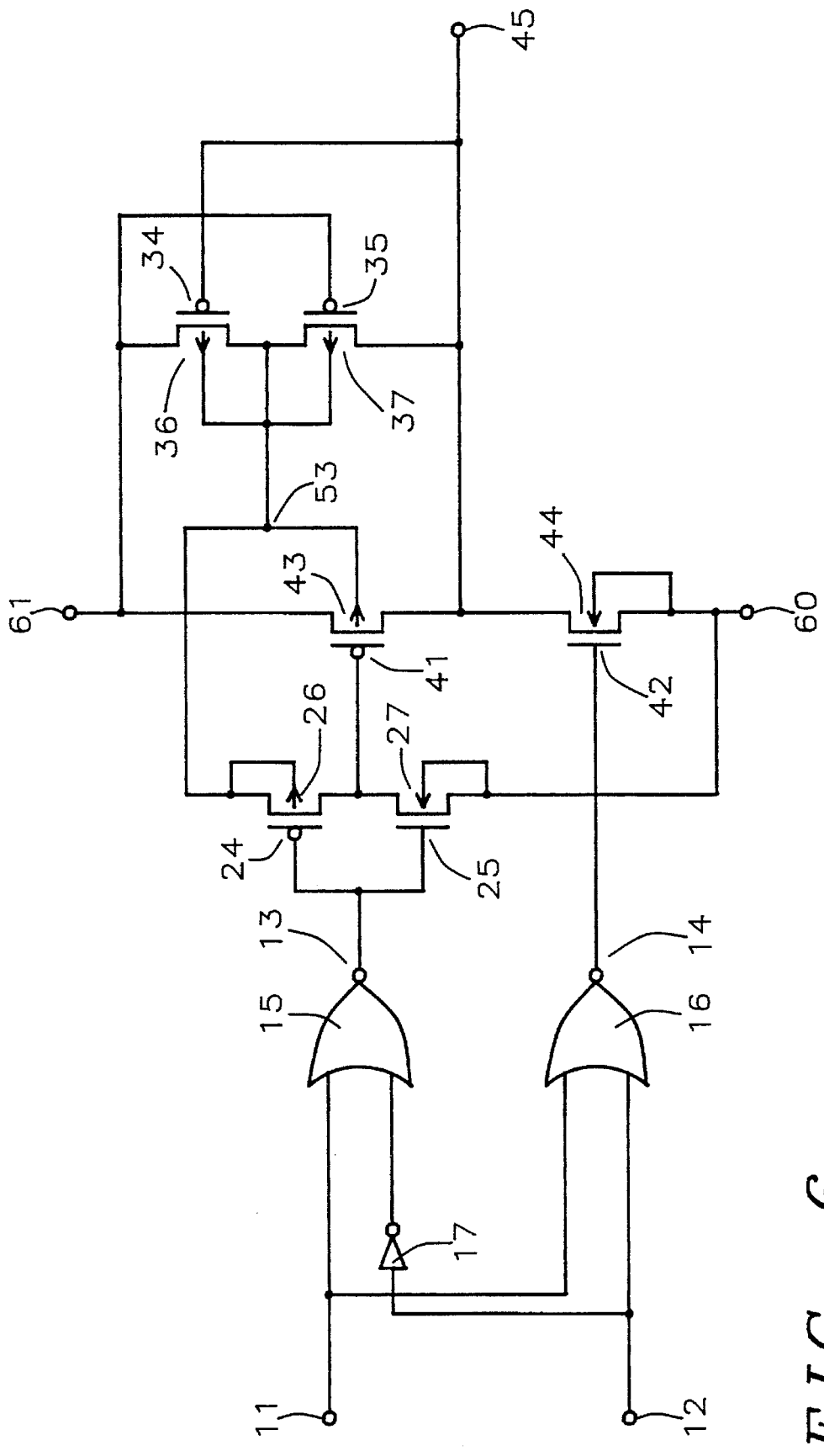
FIG. 6 shows a schematic diagram of the high voltage tolerant output buffer circuit of this invention.

Refer now to FIG. 2 and FIG. 6, there is shown an embodiment of the high voltage tolerant output buffer circuit of this invention. FIG. 2 shows a block diagram of the high voltage tolerant output buffer circuit. A logic control circuit 10 drives a CMOS, or complimentary metal oxide semiconductor, field effect transistor buffer circuit having a first P channel metal oxide semiconductor, or PMOS, field effect transistor 43 and a first N channel metal oxide semiconductor, or NMOS, field effect transistor 44 connected in series between the buffer voltage supply node, $V_{DD}$, 61 and the reference voltage supply node, 60. In this example the buffer voltage supply node 61 is at about 3.3 volts and the reference voltage supply node 60 is at ground potential.

The source of the first PMOS field effect transistor 43 is connected to the buffer voltage supply node 61, the source and the isolation well of the first NMOS field effect transistor 44 is connected to the reference voltage supply node 60, and the drain of the first PMOS field effect transistor 43 and the drain of the first NMOS field effect transistor 44 are connected to the output node 45. The voltage at the output node can go higher than the buffer voltage supply node 61, for example about 5.0 volts, which creates the potential to forward bias the PN junction of the isolation well of the first PMOS field effect transistor causing large leakage current and possible component damage. An isolation circuit 30 controls the voltage at the isolation well of the first PMOS field effect transistor 43 to prevent the PN junction of the isolation well from becoming forward biased.

The isolation circuit 30 has a first input 31 connected to the buffer voltage supply node 61, a second input 32 connected to the output node 45, and an output 33 connected to an intermediate node 53. The intermediate node 53 is also connected to the isolation well of the first PMOS field effect transistor 43. The isolation circuit 30 connects the intermediate node 53 to the buffer voltage supply node 61 when the voltage at the buffer voltage supply node 61 is equal to or greater than the voltage at the output node 45 and to the output node 45 when the voltage at the output node 45 is greater than the voltage at the buffer voltage supply node 61. By switching the larger of either the voltage at the output node or the voltage at the buffer voltage supply node to the isolation well the PN junction of the isolation well will never become forward biased.

Figure 3:
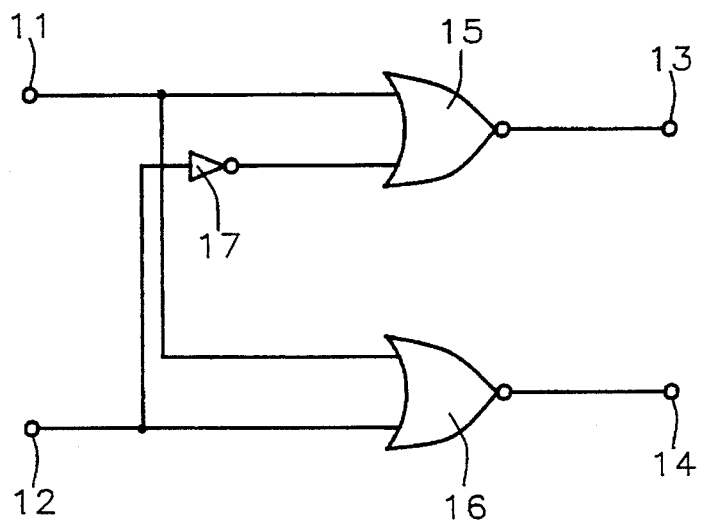
FIG. 3 shows a diagram of a control logic circuit.

The schematic diagram for the control logic circuit 10 is shown in FIG. 3. The control logic circuit has an inverter 17, a first OR-INVERT, or NOR, circuit 15, and a second NOR circuit 16. The tristate control signal is connected to the tristate control input node 11 and the data control signal is connected to the data control node 12. When the tristate control signal is a logical one there is a logical zero at both the first output node 13 and the second output node 14. When the tristate control signal is a logical zero the signal at the first output node is the same as the data control signal and the signal at the second output node 14 is the same as the inverse of the data control signal.

Refer again to FIG. 2. When the signal at the first output 13 of the control logic circuit 10 is a logical one, the voltage at the gate 41 of the first PMOS field effect transistor 43 must be at the reference supply voltage supplied to the reference voltage node 60, which is zero volts in this example. When the signal at the first output 13 of the control logic circuit 10 is a logical zero, the voltage at the gate 41 of the first PMOS field effect transistor 43 must be at the larger of either the voltage at the output node 45 or the voltage at the buffer voltage supply node 61 which is the voltage at the intermediate node 53. This is accomplished by the isolation circuit 30 passing the larger of either the voltage at the output node 45 or the voltage at buffer voltage supply node 61 to the intermediate node 53 and the feedback control circuit 20 passing the voltage at the intermediate node to the gate 41 of the first PMOS field effect transistor 43. Both the feedback control circuit 20 and the isolation circuit will be explained later.

The feedback control circuit 20 has a first input 21 connected to the first output 13 of the control logic circuit, a second input 22 connected to the intermediate node 53, a third input 29 connected to the reference voltage node 60, and an output 23 connected to the gate 41 of the first PMOS field effect transistor 43. When the signal at the first output 13 of the control logic circuit 10 is a logical one the feedback control circuit 20 connects the gate 41 of the first PMOS field effect transistor 43 to the reference voltage supply node 60. When the signal at the first output 13 of the control logic circuit 10 is a logical zero the feedback control circuit 20 connects the gate 41 of the first PMOS field effect transistor 43 to the intermediate node 53.

Figures 4, 5:
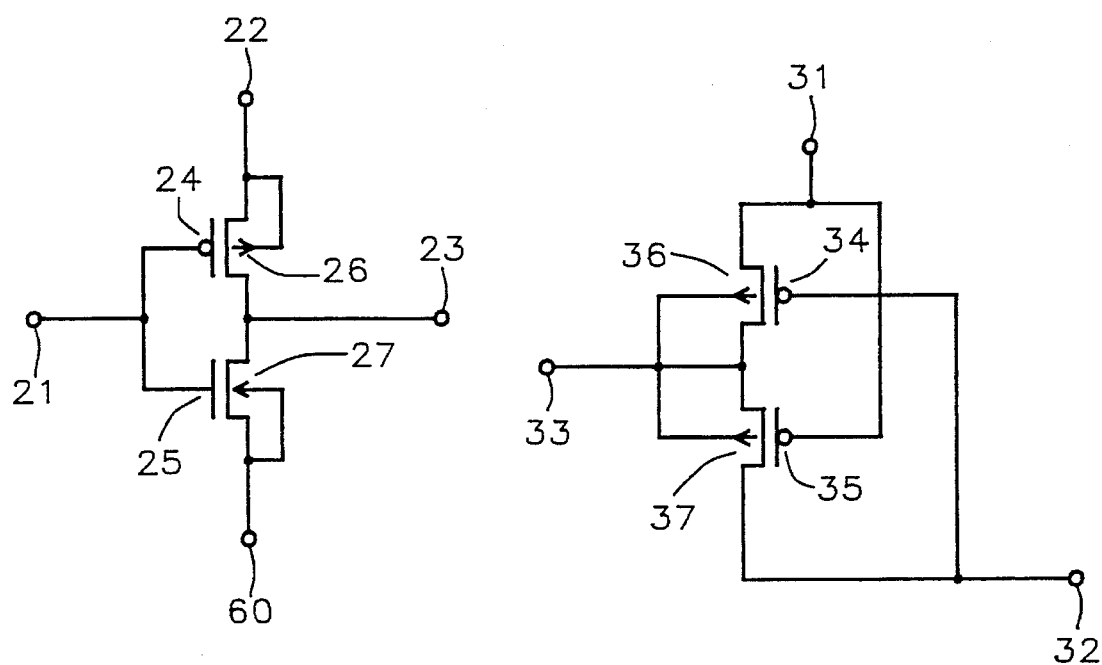
FIG. 4 shows a schematic diagram of the feedback circuit of this invention.
FIG. 5 shows a schematic diagram of the isolation circuit of this invention.

Refer now to FIG. 4, there is shown an embodiment of the feedback control circuit. The feedback control circuit has a second PMOS field effect transistor 26 and a second NMOS field effect transistor 27. The source and the isolation well of the second PMOS field effect transistor 26 are connected to the second input 22. The source and the isolation well of the second NMOS field effect transistor 27 are connected to the reference voltage supply node 60. The gate 24 of the second PMOS field effect transistor 26 and the gate 25 of the second NMOS field effect transistor 27 are connected to the first input 21. The drain of the second PMOS field effect transistor 26 and the drain of the second NMOS field effect transistor 27 are connected to the output 23 of the feedback circuit. When the signal at the first input 21 of the feedback circuit is a logical zero the second PMOS field effect transistor 26 is turned on, the second NMOS field effect transistor 27 is turned off and the output 23 of the feedback circuit 23 is connected to the second input node 22 of the feedback circuit, which can be connected to the intermediate node. When the signal at the first input 21 of the feedback circuit is a logical one the second PMOS field effect transistor 26 is turned off, the second NMOS field effect transistor 27 is turned on and the output 23 of the feedback circuit 23 is connected to the reference voltage supply node 60.

Refer again to FIG. 2. The voltage at the isolation well of the first PMOS field effect transistor 43 must be the larger of the voltage at the buffer voltage supply node 61 or the voltage at the output node 45. This is accomplished with an isolation circuit 30 having a first input 31, a second input 32, and an output 33.

Refer now to FIG. 5, there is shown an embodiment of an isolation circuit. The isolation circuit has a third PMOS field effect transistor 36 and a fourth PMOS field effect transistor 37. The source of the third PMOS field effect transistor 36 and the gate 35 of the fourth PMOS field effect transistor 37 are connected to the first input 31 of the isolation circuit. The source of the fourth PMOS field effect transistor 37 and the gate 34 of the third PMOS field effect transistor 36 are connected to the second input 32 of the isolation circuit. The drains and isolation wells of the third 36 and fourth 37 PMOS field effect transistors are connected to the output 33 of the isolation circuit. If the voltage at the first input 31 of the isolation circuit is larger than the voltage at the second input 32 of the isolation circuit the first input 31 will be connected to the output 33 through the third PMOS field effect transistor 36. If the voltage at the second input 32 of the isolation circuit is larger than the voltage at the first input 31 of the isolation circuit the second input 32 will be connected to the output 33 through the fourth PMOS field effect transistor 37. This accomplishes the requirements of the isolation circuit.

Refer now to FIG. 6, there is shown an embodiment of the high voltage tolerant buffer output circuit. The control logic circuit comprising an inverter 17, a first NOR circuit 15, and a second NOR circuit 16 and having a tristate control input node 11 and a data control input node 12 is the same as described earlier and shown in FIG. 3. The first output 13 of the control logic circuit is connected to the gate 24 of the second PMOS field effect transistor 25 in the feedback control circuit and the second output 14 of the control logic circuit is connected to the gate 42 of the first NMOS field effect transistor 44 in the CMOS buffer circuit.

The feedback control circuit has a second PMOS field effect transistor 26 and a second NMOS field effect transistor 27. The source and the isolation well of the second PMOS field effect transistor 26 are connected to the intermediate node 53. The source and the isolation well of the second NMOS field effect transistor 27 are connected to the reference voltage supply node 60. The gate 24 of the second PMOS field effect transistor 26 and the gate 25 of the second NMOS field effect transistor 27 are connected to the first output 13 of the control logic circuit. The drain of the second PMOS field effect transistor 26 and the drain of the second NMOS field effect transistor 27 are connected to the gate 41 of the first PMOS field effect transistor 43 in the CMOS buffer output circuit.

The isolation well of the first PMOS field effect transistor 43 in the CMOS buffer output circuit is connected to the intermediate node 53. The source of the first PMOS field effect transistor 43 is connected to the buffer voltage supply node 61. The source and the isolation well of the first NMOS field effect transistor 43 is connected to the reference voltage supply node 60. The drains of the first PMOS field effect transistor 43 and the first NMOS field effect transistor 44 are connected to the output node 45.

The isolation circuit comprises a third PMOS field effect transistor 36 and a fourth PMOS field effect transistor 37. The source of the third PMOS field effect transistor 36 and the gate 35 of the fourth PMOS field effect transistor 37 are connected to the buffer voltage supply node 61. The source of the fourth PMOS field effect transistor 37 and the gate 34 of the third PMOS field effect transistor 36 are connected to the output node 45. The drains and isolation wells of the third 36 and fourth 37 PMOS field effect transistors are connected to the intermediate node 53. If the voltage at the buffer voltage supply node 61 is larger than the voltage at the output node 45 the buffer voltage supply node 61 will be connected to the intermediate node 53 through the third PMOS field effect transistor 36. If the voltage at the output node 45 is larger than the voltage at the buffer voltage supply node 61 the output node 45 will be connected to the intermediate node 53 through the fourth PMOS field effect transistor 37. This prevents the PN junction in the isolation well of the first PMOS field effect transistor 43 from becoming forward biased.

When the signal at the first output 13 of the logic control circuit a logical zero the second PMOS field effect transistor 26 in the feedback control circuit is turned on, the second NMOS field effect transistor 27 in the feedback control circuit is turned off and the gate 41 of the first PMOS field effect transistor 43 is connected to the intermediate node 45. When the signal at the first output 13 the logic control circuit is a logical one the second PMOS field effect transistor 26 is turned off, the second NMOS field effect transistor 27 is turned on and the gate 41 of the first PMOS field effect transistor 43 is connected to the reference voltage supply node 60.

While the invention has been particularly shown and described with reference to the preferred embodiments thereof, it will be understood by those skilled in the art that various changes in form and details may be made without departing from the spirit and scope of the invention.

What is claimed is:

1. A high voltage tolerant output buffer circuit, comprising:

a buffer voltage supply node having a first voltage level;

a reference voltage supply node having a reference voltage level;

an output node;

an intermediate node;

a control logic circuit having a data control input, a tristate control input, a first output, and a second output wherein said first output and said second output are at a logical zero level when said tristate control input is at a logical one level, said first output is at the same logic level as said data control input when said tristate control input is at a logical zero level, and said second output is at the inverse of the logic level at said data control input when said tristate control input is at a logical zero level;

an output buffer circuit having a first P channel field effect transistor and a first N channel field effect transistor each said field effect transistor having a gate, a source, a drain, and an isolation well wherein said gate of said first N channel field effect transistor is connected to said second output of said control logic circuit, said source of said first P channel field effect transistor is connected to said buffer voltage supply node, said source and said isolation well of said first N channel field effect transistor are connected to said reference voltage supply node, and said drain of said first N channel field effect transistor and said drain electrode of said first P channel field effect transistor are connected to said output node;

means for feedback whereby said gate of said first P channel field effect transistor is connected to said intermediate node when said tristate control input of said control logic circuit is at a logical one level or said data control input of said control logic circuit is at a logical zero level and to said reference voltage level when said tristate control input of said control logic circuit is at a logical zero level and said data control input of said control logic circuit is at a logical one level; and means for isolation whereby said isolation well of said first P channel field effect transistor and said intermediate node are connected to said buffer voltage supply node when the voltage at said output node is less than or equal to said first voltage level and to said output node when the voltage at said output node is greater than said first voltage level, wherein said means for isolation comprises no more than two field effect transistors.

2. The high voltage tolerant output buffer circuit of claim 1 wherein said means for feedback consists of a feedback circuit having a first input, a control input, and an output wherein said control input of said feedback circuit is connected to said first output of said control logic circuit, said first input of said feedback circuit is connected to said intermediate node, and said output of said feedback circuit is connected to said gate of said first P channel field effect transistor.

3. The high voltage tolerant output buffer circuit of claim 2 wherein said feedback circuit comprises a second P channel field effect transistor having a gate, a source, a drain, and an isolation well and a second N channel field effect transistor having a gate, a source, a drain, and an isolation well wherein said source and said isolation well of said second P channel field effect transistor are connected to said first input of said feedback circuit, said source and said isolation well of said second N channel field effect transistor are connected to said reference voltage supply node, said gate of said second P channel field effect transistor and said gate of said second N channel field effect transistor are connected to said control input of said feedback circuit, and said drain of said second P channel field effect transistor and said drain of said second N channel field effect transistor are connected to said output of said feedback circuit.

4. The high voltage tolerant output buffer circuit of claim 1 wherein said means for isolation consists of an isolation circuit having a first input, a second input, and an isolation output wherein said first input of said isolation circuit is connected to said buffer voltage supply node having said first voltage level, said second input of said isolation circuit is connected to said output node, and said isolation output of said isolation circuit is connected to said intermediate node.

5. The high voltage tolerant output buffer circuit of claim 4 wherein said isolation circuit comprises a third P channel field effect transistor having a gate, a source, a drain, and an isolation well and a fourth P channel field effect transistor having a gate, a source, a drain, and an isolation well wherein; said source of said third P channel field effect transistor and said gate of said fourth P channel field effect transistor are connected to said first input of said isolation circuit; said source of said fourth P channel field effect transistor and said gate of said third P channel field effect transistor are connected to said second input of said isolation circuit; and said drain of said third P channel field effect transistor, said isolation well of said third P channel field effect transistor, said drain of said fourth P channel field effect transistor, and said isolation well of said fourth P channel field effect transistor are connected to said isolation output of said isolation circuit.

6. The high voltage tolerant output buffer circuit of claim 1 wherein said first voltage level is about 3.3 volts.

7. The high voltage tolerant output buffer circuit of claim 1 wherein said reference voltage level is about zero volts.

8. The high voltage tolerant output buffer circuit of claim 1 wherein the voltage at said output node is between about zero and 5.0 volts.

9. The high voltage tolerant output buffer circuit of claim 1 wherein said first P channel field effect transistor and said first N channel field effect transistor are metal oxide semiconductor field effect transistors.

10. The high voltage tolerant output buffer circuit of claim 9 wherein said first P channel field effect transistor and said first N channel field effect transistor are complimentary metal oxide semiconductor field effect transistors.

11. The high voltage tolerant output buffer circuit of claim 3 wherein said second P channel field effect transistor and said second N channel field effect transistor are metal oxide semiconductor field effect transistors.

12. The high voltage tolerant output buffer circuit of claim 11 wherein said second P channel field effect transistor and said second N channel field effect transistor are complimentary metal oxide semiconductor field effect transistors.

13. The high voltage tolerant output buffer circuit of claim 5 wherein said third P channel field effect transistor and said fourth P channel field effect transistor are metal oxide semiconductor field effect transistors.

* * * * *